United States Patent [19]

Arima et al.

[11] 4,300,132

[45] Nov. 10, 1981

[54] FIRE ALARM SYSTEM

[75] Inventors: Takeo Arima, Tokyo; Akira Furuyama, Machida, both of Japan

[73] Assignee: Hochiki Corporation, Tokyo, Japan

[21] Appl. No.: 8,809

[22] Filed: Feb. 2, 1979

[30] Foreign Application Priority Data

Feb. 3, 1978 [JP] Japan .................................. 53-11311
Feb. 3, 1978 [JP] Japan .................................. 53-11312

[51] Int. Cl.³ ...................... G08B 17/10; H03K 3/281
[52] U.S. Cl. ................................... 340/629; 250/381; 331/108 D; 331/113 R
[58] Field of Search ............... 340/511, 517, 521, 522, 340/533, 526, 628, 629; 250/381, 382, 384, 385; 363/60, 61; 331/108 D, 111, 113 R, DIG. 3; 307/214

[56] References Cited

U.S. PATENT DOCUMENTS

| | | | |
|---|---|---|---|
| 3,512,106 | 5/1970 | Rosenthal | 331/111 |
| 3,713,128 | 1/1973 | Wong et al. | 340/526 |
| 3,879,717 | 4/1975 | Gruensfelder | 340/237 |
| 4,017,852 | 4/1977 | Kabat | 340/521 X |
| 4,037,206 | 7/1977 | Dobrzanski et al. | 340/629 |
| 4,041,479 | 8/1977 | Miyabe | 340/629 |
| 4,091,363 | 5/1978 | Siegel et al. | 340/629 X |
| 4,122,360 | 10/1978 | Kawagai et al. | 307/214 X |

Primary Examiner—John W. Caldwell, Sr.
Assistant Examiner—Daniel Myer
Attorney, Agent, or Firm—Sughrue, Mion, Zinn, Macpeak and Seas

[57] ABSTRACT

A fire alarm having in a single unit a battery and a fire detecting section energized by the battery to detect abnormal environmental conditions such as heat and smoke to provide an output signal. A voltage decrement detecting section detects a voltage decrement of the battery to provide an output signal. A warning unit such as a buzzer is coupled to a switching circuit for operating the warning unit upon reception of the output signal from either the fire detecting section or the voltage decrement detecting section through an input terminal thereof. To reduce power consumption, the system uses a multivibrator having C-MOS IC, inverters. The output of the voltage decrement detecting section is connected to a control input terminal of the switching circuit and external connection terminals and the output of the fire detecting section are connected to the control input terminal of the switching circuit through diodes, adapted to prevent the influence of the output signal of the voltage decrement detecting section.

32 Claims, 7 Drawing Figures

FIRE ALARM SYSTEM

BACKGROUND OF THE INVENTION

This invention relates to a so-called single station type fire alarm system which comprises an electric source, a fire detecting section, a warning unit such as a buzzer, etc. in one housing to detect a fire and to produce a warning signal. This invention also relates to a multivibrator used in the detection circuitry.

A fire alarm system of this type is provided with detectors adapted to detect smoke, heat and flame, a warning unit such as a buzzer or a bell adapted to produce a warning signal in response to the outputs of the detectors. An electric source such as a dry battery for energizing these components is located in one housing. Such a fire alarm system is installed, as a simple warning signal producing device for home use, at crucial locations in a house such as landings or stairways. That is, the fire alarm systems are provided in rooms separately or independently from each other without having a central control device.

Accordingly, even if one fire alarm detects a fire in the respective location of a room to produce a warning signal, the warning signal cannot be transmitted to another fire alarm at another location. Since the rooms in recent houses are well insulated in terms of soundproofing and airtightness, it may be difficult for a person in one room to hear the warning signal produced in another room. Hence, at a crucial moment, such as a spreading fire, only the persons in the room where the alarm sounds can be alerted to the occurrence of the fire at the earliest moment. This may result in delay in extinguishing the fire or in evacuation from the building.

Originally, the single station type fire alarm system of this type was used as a simple warning signal producing device as described above, and therefore it was not intended to have a mutual warning signal control function. The increase in control functions leads to an increase in power requirements. Hence, a problem generally exists concerning acceptable battery lifetime without requiring large and heavy power sources. Hence, the use of circuitry having reduced power is a subject of continuing research.

This invention therefore also relates to a multivibrator employing C-MOS IC inverters, and is intended to reduce the power consumption of the multivibrator. A C-MOS IC has a variety of merits in that it is low in power consumption, may be completely operated by batteries, and is not affected by external noise. Therefore, C-MOS IC circuitry has been extensively utilized in single station type fire alarm systems using a primary battery as its electric source.

Figure 1:
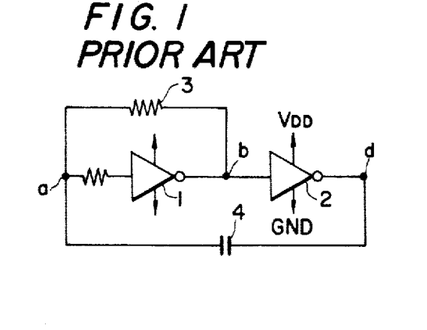
FIG. 1 is a circuit diagram showing the fundamental arrangement of a conventional multivibrator.

For instance, in a single station type fire alarm system incorporating an ionization type smoke detector, a DC—DC converter using a multivibrator with C-MOS inverters is employed to obtain a high voltage applied to the ionization chambers of the detector. Since the multivibrator is a load on the battery, it is desirable to minimize the power consumption of the multivibrator. Most of the multivibrators of this type have an arrangement as shown in FIG. 1. More specifically, in this arrangement, the periodic variation of a potential Va at the circuit point a due to a differentiation current flowing in a resistor 3 and a capacitor 4 is obtained as a pulse at the circuit points b or d by means of two C-MOS inverters 1 and 2.

The operation of this conventional multivibrator shown in FIG. 1 will now be described. As is apparent from a waveform diagram shown in FIG. 2, the potential Va at the circuit point a periodically varies at the time instants $t_0$, $t_1$, $t_2$ and so on with a time constant defined by the values of resistor 3 and capacitor 4. At the time instant $t_0$, the output of the inverter 1 is changed from a high potential level "H" (hereinafter referred to merely as an "H" when applicable) to a low potential level "L" (hereinafter referred to merely as an "L" when applicable), while the output of the inverter 2 is changed from "L" to "H". Therefore, capacitor 4 has been biased in such a manner that the circuit point d is negative and the circuit point a is positive. But, at the time instant this biasing state is inverted, and the potential Va is increased to about $(V_{DD}+V_{TH})$.

Figure 2:
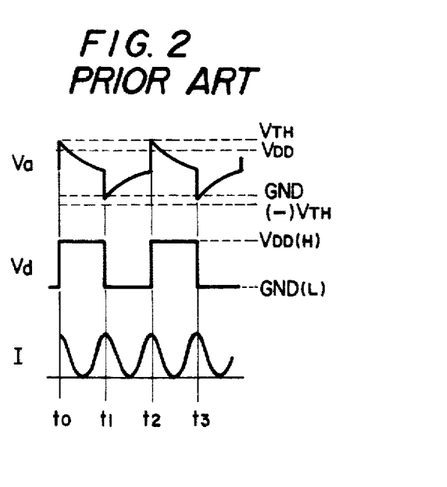
FIG. 2 is a time chart showing the operating waveforms of the vibrator shown in FIG. 1.

During the period of from $t_0$ to $t_1$, a differentiation current flows from the P channel MOS of inverter 2 through the capacitor 4 and resistor 3 to the N channel MOS of inverter 1. The potential is gradually decreased from "H". At the time instant $t_1$, the potential Va, gradually decreased, reaches the circuit threshold voltage $V_T$ of inverter 1. As a result, the states of inverters 1 and 2 are both inverted, and the potential at the circuit point b is changed from "L" to "H" while the potential Vd at the circuit point d. Accordingly, capacitor 4 is reversely biased again and the potential Va is instantaneously decreased to about $-V_{TH}$.

During the period of from $t_1$ to $t_2$, a differentiation current flows from the P channel MOS of inverter 1 through resistor 3 and capacitor 4, in the stated order, to the N channel MOS of inverter 2. The potential Va is gradually increased. At the time instant, $t_2$, the potential Va reaches the circuit threshold voltage $V_T$, and the same state as that in the case of the time instant $t_0$ is provided.

As the above-described operation is repeatedly carried out, the output provided, for instance, at the circuit point d is an oscillation output having a constant period. In FIG. 2, a curve I indicates the variation with time of the current consumption of the circuit. The variation tends to increase when the potential Va reaches approximately the circuit threshold voltage of inverter 1. Accordingly, especially in the case where the oscillation period of the multivibrator is set to a short value, the current consumption cannot be disregarded if the variation occurs slowly when the potential Va passes the above described threshold voltage.

Within the prior art a number of patents are known generally relating to this technology. Typical pertinent ones are U.S. Pat. Nos. 4,004,288; 4,017,852; and 4,030,086. The '288 patent discloses a battery operated detection unit for independent monitoring of smoke. A smoke detector is used to produce an output to latch circuitry and a logic gate to produce an audible alarm. An oscillator is also coupled to the logic gate such that in the absence of an alarm signal, a light is energized at a rate dependent on oscillator frequency to indicate that the system is in an operable state. A battery monitoring circuit shown in FIG. 5 of the patent is employed to provide the audible alarm if the battery voltage drops below a predetermined level. Such a system, while workable suffers from several practical drawbacks. It is not capable of being adapted into a network and the user has no way of initially noting the difference between an alarm condition or one of low battery. Also, the system requires relatively large amounts of power for operation.

The '852 patent relates to a smoke detector having interconnect lines to couple a number of different units as shown in FIG. 2 therein. The device uses a network of silicon controlled rectifiers (SCR) and a programmable unijunction transistor (PUT) in the detector and supervision circuits. The device is not self powered since it uses line connections. Accordingly, as shown it must use a transformer (element 12 in FIG. 1) to handle the input line voltage. Such a device cannot therefore be placed at random or selective locations but must be near a power line. This leads to unsightly wires and installation problems. The convenience of installing detectors in locations specific for their function such as in stair wells is lost unless a power line is present.

Finally, the reference Salem ('086) relates to a battery operated smoke detection device with a monitoring circuit for sensing low battery condition. The patent relates specifically to a device that will provide a permanent visual alarm and notice that the battery should be replaced. This is in the form of an indicator 96' shown in FIG. 2 of the patent held in a closed position by a tab 125 biased with a spring 112 and an energizable coil 92 coupled to a latch 120. When the low battery circuit sense a condition below a predetermined threshold, the latch 120 releases the tab 125 and the indicator 96' becomes visable. Thereafter and until the battery is depleted a horn 50 will sound as a result of discharge of capacitor 82 to provide an audible warning signal. Therefore, even if the battery is completely exhausted the visual warning will remain. This patent while showing a reliable and efficient low battery sensor is not capable of network operations.

SUMMARY OF THE INVENTION

Accordingly, an object of this invention is to provide a fire alarm system in which a plurality of fire alarm devices equal in construction to one another are connected together so that a warning signal produced by one fire alarm device is transmitted to the remaining devices.

More specifically, an object of the invention is to provide a fire alarm device in which its warning signal can be transmitted to another fire alarm device through a mutual connection line.

Yet another object of this invention is to provide a warning unit operated upon reception of a warning signal from another fire alarm, yet when its battery voltage is decreased to a predetermined value, the warning unit will produce a warning signal different from that generated in the case of a fire.

A further object of this invention is to provide a novel multivibrator that is low in power consumption yet reliable and compact useable in a fire alarm system.

Still another object of this invention is to provide a multivibrator in which the variation of the potential Va is made abruptly when the potential Va passes the circuit threshold voltage, whereby the current consumption is reduced with a short oscillation period.

That is, the fire alarm device according to the invention comprises a single unit having a fire detecting section for detecting abnormal environmental conditions such as smoke, heat and fires to provide a warning signal output. A voltage decrement detecting section, when the supply voltage is decreased, produces, for instance, an intermittent detection output different from the warning signal output. A warning unit such as buzzer is coupled to a switching circuit for operating the warning unit upon reception of the warning signal output or the detection output through its control input terminal. A replaceable battery serves as an electric source for these components. The output of the fire detecting section is connected to the external connection terminals. The control input terminal of the switching circuit is connected to the output of the voltage decrement detecting section and the external connection terminals and the output of the fire detecting section are connected to the control input terminal of the switching circuit through diodes which are adapted to prevent the influence of the output signal of the voltage decrement detecting section.

A plurality of fire alarm devices according to the invention are connected to one another through the external connection terminals to form a network or composite alarm system. Therefore, when the fire detecting section of one fire alarm device produces a predetermined output signal, the warning units of all of the fire alarm devices are actuated. In the case where the voltage decrement detecting section of one fire alarm device produces its output signal, only its own warning unit is operated to intermittently produce a sound, and this signal is not transmitted to the remaining fire alarm device by means of the aforementioned diodes.

In the multivibrator according to the invention, two C-MOS inverters are employed, and the variation of a differentiation current applied to the input terminal of one of the two C-MOS inverters is made abruptly by means of a transistor. Hence, the time interval for which the consumption current flows substantially with the threshold value of the inverter is reduced. This greatly contributes to the reduction of the power consumption. Furthermore, the transistor is externally biased to control the start and stop of the multivibrator. Thus, the multivibrator according to the invention has a variety of additional uses in addition to use in an alarm system.

The preferred embodiment of the multivibrator and fire alarm device incorporating it according to this invention will be described in detail with reference to the accompanying drawings.

DESCRIPTION OF THE PREFERRED EMBODIMENT

Figure 3:
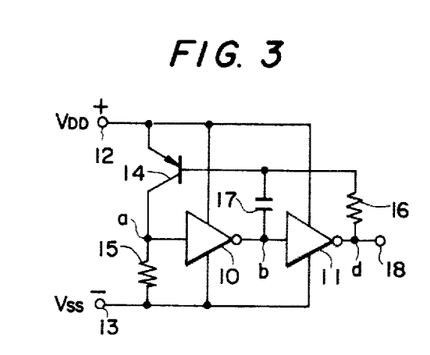
FIG. 3 is a circuit diagram showing the fundamental arrangement of a multivibrator according to this invention.

FIG. 3 illustrates the fundamental circuit diagram of the multivibrator according to this invention. In FIG. 3, reference numerals 10 and 11 designate first and second C-MOS inverters, respectively. The output terminal of the first inverter 10 is connected to the input terminal of the second inverter 11; that is, the inverters are connected in series to each other.

A voltage $+V_{DD}$ is applied to a positive electric source terminal 12, while a voltage $-V_{SS}$ is applied to a negative electric source terminal 13. In practice, a battery is connected between terminals 12 and 13, so that the voltages $V_{DD}$ and $-V_{SS}$ are applied to the terminals, respectively. The inverters 10 and 11 are parallel-connected between the terminals 12 and 13, and a series circuit of a transistor 14 and a second resistor 15 is connected between the terminals 12 and 13.

More specifically, the transistor 14 is of the PNP type, and emitter of the transistor 14 is connected to the positive electric source terminal 12, while the collector is connected through the second resistor 15 to the negative electric source terminal 13. The resistance of the second resistor 15 is selected to be high so that when the transistor 14 is rendered conductive, the current is extremely small. The connection point of the collector and the second resistor 15 is connected to the input terminal of the first inverter 10. The output terminal of the second inverter 11 is connected through a first resistor 16 and a capacitor 17, in the stated order, to the input terminal of the second inverter 11. The connection point of the first resistor 16 and the capacitor 17 is connected to the base of the transistor 14.

In FIG. 3, the output terminal of the second inverter 11 is employed as the output terminal of the multivibrator. However, if it is required to obtain an inversion output, it may be obtained at the output terminal of the first inverter 10.

The operation of the circuit shown in FIG. 3 will now be described. In this connection, it is assumed that the values of the circuit elements are selected so that the transistor 14 is rendered conductive (on) upon application of the supply voltage. As soon as the transistor 14 is rendered conductive, a potential Va at the circuit point a is set to a high potential level "H", a potential Vb at the circuit point b is set to a low potential level "L", and a potential Vd at the circuit point d is set to "H". Accordingly, current is allowed to flow into the capacitor 17 through the path of the P channel MOS of the inverter 11 and the resistor 16 and the path of the emitter and the base of the transistor 14 from the terminal 12. It is further allowed to flow from the capacitor 17 through the N channel MOS of the inverter 10 to the negative terminal 13.

As a result, the base potential of the transistor 14 is gradually increased by the charge in the capacitor 17, and finally the transistor 14 is rendered non-conductive. When the transistor 14 is rendered non-conductive, the potentials Va, Vb and Vd are set to, "L", "H" and "L", respectively. Therefore, current is allowed to flow from the positive terminal 12 through the P channel MOS of the inverter 10, the capacitor 17, the resistor 16 and the N channel MOS of the inverter 11, in the stated order, to the negative terminal 13. As a result, the base potential of the transistor 14 is gradually decreased, and finally the transistor 14 is rendered conductive. As the abovedescribed operation is repeatedly carried out, the circuit will oscillate with a predetermined period, and the oscillation output is provided at the output terminal 18.

Figure 4:
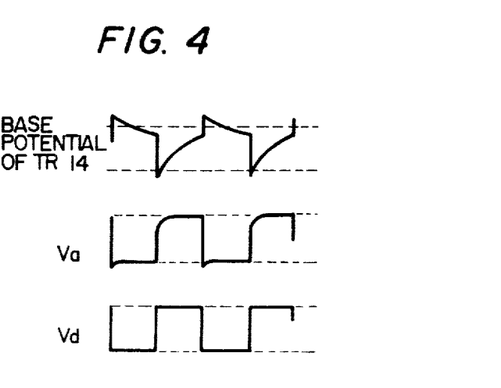
FIG. 4 is a time chart showing the operating waveforms of the multivibrator shown in FIG. 3.

The variations of the base potential of the transistor 14, the potential Va at the circuit point a and the potential Vd at the circuit point d are indicated in FIG. 4. Time is plotted on the horizontal axis.

Figure 5:
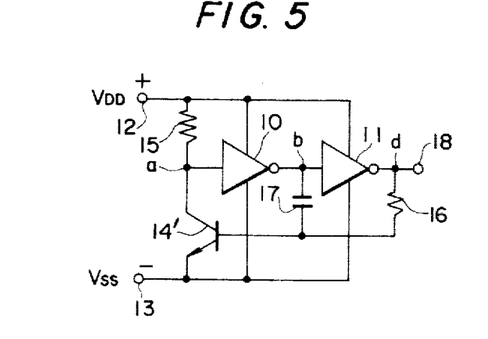
FIG. 5 is a circuit diagram illustrating another example of the multivibrator according to the invention.

In the example shown in FIG. 3, the PNP type transistor 14 is employed; however, it may be an NPN type transistor 14' as shown in FIG. 5. In this case, the operation is substantially similar to that of the above-described case except that the on-off states of the transistor are opposite to those of the transistor 14 described above.

In any case, the base potential of the transistor 14 or 14' changes relatively slowly, but this slow change provides an abrupt change at the collector with the aid of the switching operation. Accordingly, the potential Va at the circuit point a changes abruptly and instantaneously exceeds the threshold potential of the inverter 10. As a result, the time integration values of current consumption of the inverters 10 and 11 are minimized, which leads to an reduction of power consumption.

Figure 6:
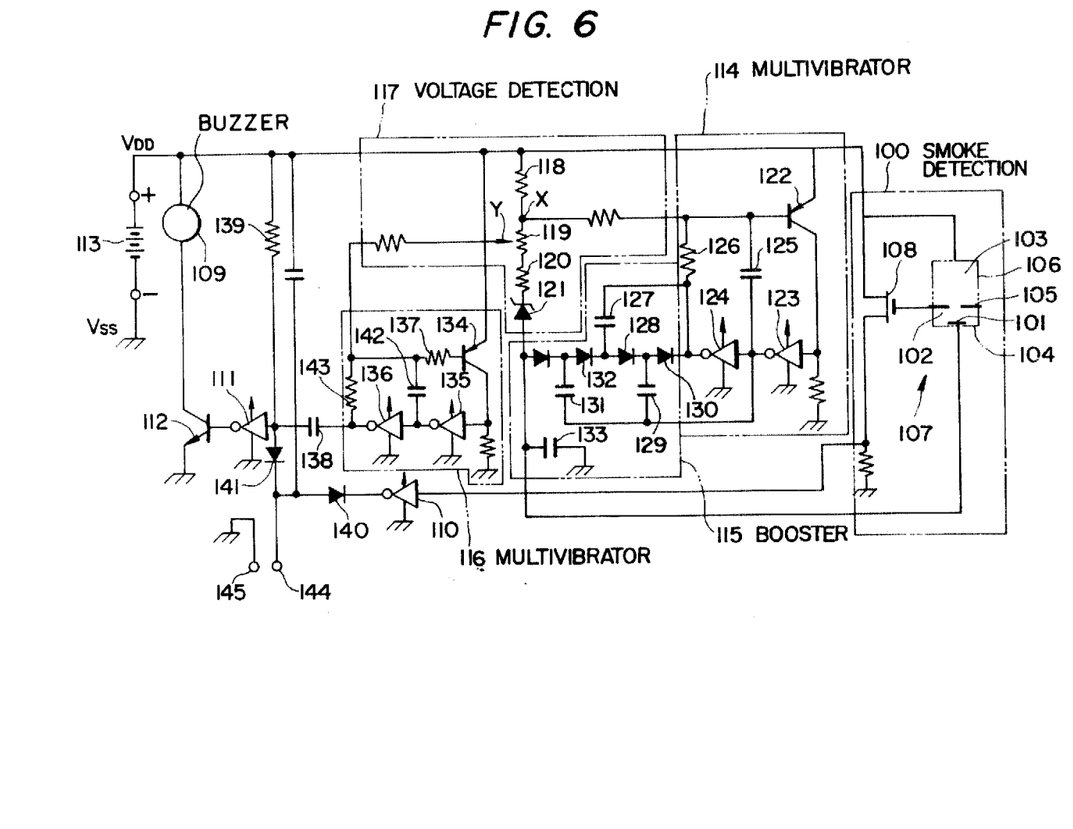
FIG. 6 is a circuit diagram showing a fire alarm system in which the multivibrator according to the invention is employed.

FIG. 6 illustrates a circuit diagram showing a single station type fire alarm means to which the multivibration according to the invention is applied.

In FIG. 6, reference numeral 100 designates a smoke detecting circuit which is provided with an ionization type smoke detector 107. This smoke detector 107 comprises an inner electrode 104, an intermediate electrode 105 and an outer electrode 106. The electrodes 104 through 106 form an inner ionization chamber 102 and an outer ionization chamber 103 which are both ionized by a radiation source 101. The outer ionization chamber 103 is constructed so that external smoke can readily enter chamber 103, while the inner ionization chamber 102 is constructed so that external smoke cannot readily enter chamber 102. The intermediate electrode 105 is connected to the gate electrode of a field-effect transistor 108.

With a voltage appearing as a predetermined voltage division potential during the normal period with the aid of an ionization current which flows according to a voltage applied to the inner electrode 104 and the outer electrode 106, the field-effect transistor 108 is maintained in cut-off state. The radiation intensity of the radiation source 101 and the interelectrode distances are determined so that the cut-off state can be obtained. When the smoke of, for instance, a fire enters the outer ionization chamber 103, the ionization current mentioned above is changed, and the voltage division state is also changed. When the potential of the intermediate electrode 105 is decreased to a predetermined value, the field-effect transistor 108 is rendered conductive. In order to operate a warning buzzer 109 with the output of the transistor 108 when it is rendered conductive, a transistor 112 serving as a switching circuit is provided which receives an control input signal through a series circuit comprising an inverter 110, diodes 140 and 141 and an inverter 111.

In this fire alarm device, the power supply is an ordinary dry battery 113; that is, no special battery is employed therein. Thus, it is possible to miniaturize the fire alarm device. The voltage of the power supply is low; however, a high voltage is employed as the ionizing voltage applied across the outer electrode and the inner electrode.

This high voltage is obtained from the dry cell 113 by means of a first multivibrator 114 comprising two C-MOS inverters 123 and 124, and a booster circuit 115 forming a voltage tripler circuit. This high voltage is applied to the ionization chambers 102 and 103 so that the potential of the smoke detecting section is greatly changed by the entering of smoke thereby to positively operate the fire alarm means. The voltage of the battery 113 is applied directly to the circuit elements other than the ionization chambers.

A voltage detecting circuit 117 formed with a second multivibrator 116 comprising Two C-MOS inverters 135 and 136 is provided so that, only when the output voltage of the above-described booster circuit 115 is decreased to a predetermined value, the multivibrator 114 is operated to provide its oscillation output.

In the circuit shown in FIG. 6, the increased voltage is a negative voltage such as −10 V. The difference 14.5 V between this voltage −10 V and the positive potential, for instance 4.5 V, of the dry cell 113 is applied across the inner and outer electrodes 104 and 106. The output voltage of the booster circuit 115 is supplied to the inner electrode 104 and is consumed by a series circuit comprising resistors 118, 119 and 120 and a zener diode 121 in the voltage detecting circuit 117. The reduction of the output of the booster circuit 115 causes a potential at the connection point Z of the resistors 118 and 119 to increase. As a result, a transistor 122 in the multivibrator 114 is rendered non-conductive. Accordingly, the input terminal of one C-MOS inverter 123 is set to "L" and the output terminal thereof is set to "H", while the input and output terminals of the other C-MOS inverter 124 are set to "H" and "L", respectively.

As a result, current is allowed to flow in a loop comprising the positive electrode of the battery 113, the P channel MOS of the inverter 123, a capacitor 125, a resistor 126, the N channel MOS of the inverter 124 and the negative electrode of the battery 113. Thus, the base potential of the transistor 122 is decreased with a predetermined time constant from "H", and when it is decreased to a predetermined value, the transistor 122 is rendered conductive (on). By this switching operation, the input and output terminals of the inverter 123 are set to "H" and "L", respectively, while the input and outer terminals of the inverter 124 are set to "L" and "H", respectively.

As a result, current is allowed to flow in the following loop:

```
The positive electrode of the battery 113 ------
  the P channel MOS of the inverter 124--the resistor 126
--<                                                       >--
   the emitter of the transistor 122--the base
-- the capacitor 125--the N-channel MOS of the inverter 123--
-- the negative electrode of the battery 113.
```

Thus, the base potential of the transistor 122 is gradually increased. When this base potential reaches a voltage lower by about 0.6 V then the positive voltage $V_{DD}$, the transistor 122 is rendered non-conductive, whereby the input terminal of the inverter 123 is set to "L". The above-described operation is repeatedly carried out, thus causing the oscillation.

In the booster circuit 115, by the above-described oscillation, when the output terminal of the inverter 124 is set to "H", a voltage $(V_{DD}-Vf)/2$ is applied to capacitors 127 and 129 through a loop comprising the positive electrode of the battery 113, the P channel MOS of the inverter 124, the capacitor 127, a diode 128, the capacitor 129, the N channel MOS of the inverter 123 and the negative electrode of the battery 113. The above-described "Vf" is the forward voltage drop of the diodes 128, 130 and 132, and is of the order of 0.5 V in general. When the output terminal if subsequently set to "L", a voltage $(V_{DD}-Vf)$ is charged to the capacitor 129 while the voltage $(V_{DD}-Vf)/2$ is charged to each of a capacitor 131 and the capacitor 127 through the following loop:

```
The positive electrode of the battery 113    the P
channel MOS of the inverter 123 -----------------
   the capacitor 129-- the diode 130                  \
--<                                                    >--
   the capacitor 131-- the diode 132--the capacitor 127
--the N-channel MOS of the inverter 124--the negative electrode
of the battery 113.
```

Thus, the base potential of the transistor 122 is gradually increased. When this base potential reaches a voltage lower by about 0.6 V than the positive voltage $V_{DD}$, the transistor 122 is rendered non-conductive and hence the input terminal of the inverter 123 is set to "L". The above-described operation is repeatedly carried out, thus causing the oscillation.

In the booster circuit 115, as a result of the above-described oscillation, when the output terminal of inverter 124 is set to "H", a voltage $(V_{DD}-Vf)/2$ is applied to capacitors 127 and 129 through a loop comprising the positive electrode of the battery 113, the P channel MOS of the inverter 124, the capacitor 127, a diode 128, the capacitor 129, the N channel MOS of the inverter 123 and the negative electrode of the 133. The above-described "Vf" is the forward voltage drop of the diodes 128, 130 and 132, and is in general of the order of 0.5 V. When the output terminal is subsequently set to "L", a voltage $(V_{DD}-Vf)$ is applied to the capacitor 129 while the voltage $(V_{dd}-Vf)/2$ is applied to each of a capacitor 131 and the capacitor 127 through the following loop:

```
The positive electrode of the battery 113    the P
channel MOS of the inverter 123 -----------------
   the capacitor 129--the diode 130                  \
--<                                                   >--
   the capacitor 131--the diode 132--the capacitor 127
--the N-channel MOS of the inverter 124--the negative electrode
of the battery 113.
```

Accordingly, the following voltage is applied to a capacitor 133 negatively with respective to the negative electrode of the battery 113:

$$(V_{DD}-Vf)/2+[(V_{DD}-Vf)/2+(V_{DD}-Vf)/2]+[(V_{DD}-Vf)+(V_{DD}-Vf/2]=3(V_{DD}-Vf)$$

When the increased voltage reaches a predetermined value as the voltage increment is advanced as described above, the potential at the connection point X is decreased to a predetermined value. Therefore, the base potential of the transistor 122 in the multivibrator 114 is decreased to a predetermined value. The transistor 122 is therefore rendered conductive. When the transistor 122 is rendered conductive, the oscillation of the multivibrator 114 is stopped, and the voltage increment operation of the booster circuit 115 is also stopped.

When the increased voltage of the capacitor 133, consumed by the ionization chambers and the resistor in the voltage detecting circuit 117, is decreased (being allowed to approach the positive potential), the potential at the connection point X is increased. As a result the transistor 122 is rendered non-conductive, the multivibrator 114 starts its oscillation again as was described before, and the capacitor 133 in the booster circuit 115 is again charged. The potential of the capacitor 133 is maintained at a predetermined level by the repetition of the above-described operation.

The fire alarm device of FIG. 6 further comprises a multivibrator 116. When the voltage of the battery 113 is decreased to a predetermined value, warning buzzer 109 is actuated intermittently by multivibrator 116 to give an alarm different from that in the case of a fire to thereby indicate the necessity of replacement of battery 113. In FIG. 6 the resistor 119 in the voltage detecting circuit 117 is a variable resistor at the movable contact Y of which an optional voltage more negative than the potential at the connection point X can be provided. The variable resistor can be set so that, when the voltage of battery 113 is sufficiently high and the above-described voltage increment is also sufficiently carried out, the potential of the movable contact Y is lower than the voltage $V_{BE}$ of a transistor 134.

Accordingly, in this state, transistor 134 is conductive, and the input and output terminals of an inverter 135 are set to "H" and "L", while the input and output terminals of an inverter 136 are set to "L" and "H", respectively. Under this condition, the base potential of transistor 134 is biased so that transistor 134 is conductive, and is in balance.

When the battery voltage is decreased and the potential at the movable contact Y is increased to a predetermined value towards the positive voltage $V_{DD}$, the base of transistor 134 is biased so that the transistor 134 is non-conductive. When the transistor 134 is rendered non-conductive, the multivibrator 116 starts its oscillation. In this case, since resistor 137 for suppressing the flow of base current is connected to the base of the transistor 134, the oscillation duty ratio is set to be about 50%. The above-described voltage detecting circuit 117 and the second multivibrator 116 form a voltage decrement detecting section. The output is applied from the second multivibrator 116 through a differentiating circuit comprising a capacitor 138 and a resistor 139 to the inverter 111. This will intermittently operate transistor 112 as will be described herein.

In this case, if the voltage of the battery 113 is normal, the output of the second multivibrator 116 is maintained at "H". When the voltage of the battery becomes lower than a predetermined value, the multivibrator 116 oscillates with a time constant defined by a large capacity capacitance 142 and a resistor 143. Its output is lowered to "L" intermittently for a short time with a period of the order of once in 30 seconds. During this low potential level "L", the inverter 111 provides a high potential level "H" output to render the transistor conductive. However, since diodes 141 and 140 prevent the inverter 110 from being affected by the low potential level "L", no current flows out of the inverter 110 even if the output of the multivibrator 116 is set to "L".

Terminals 144 and 145 are a pair of external connection terminals. The terminals 145 are grounded. The terminal 144 is connected through the diode 140 to the output terminal of the inverter 110 and is connected through the diode 141 to the input terminal of the inverter 111.

Figure 7:
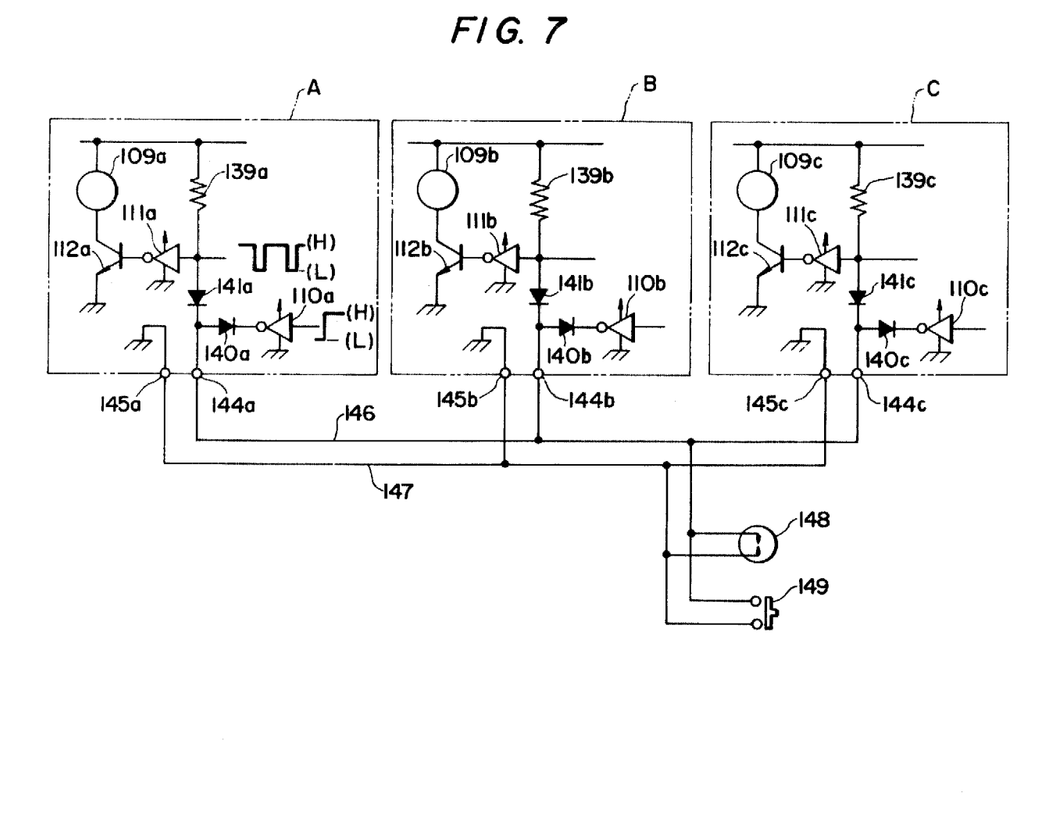
FIG. 7 is a circuit diagram showing the essential components of a plurality of fire alarm devices as shown in FIG. 6.

The fire alarm device according to the invention is a single unit in which the above-described circuitry is incorporated in one housing. A plurality of fire alarm devices according to the invention may be connected through their terminals as shown in FIG. 7. The operation of the assembly of fire alarm devices thus connected will now be described.

In FIG. 7, reference characters A, B and C designate fire alarm devices each of which is organized as shown in FIG. 6, and the components which have been described with reference to FIG. 6 have therefore been similarly numbered with suffix letters a, b and c to indicate the fire alarm device A, B and C to which they belong for convenience in description.

Reference numerals 146 and 147 designate connection lines to which the external connection terminals 144a, 144b and 144c and 145a, 145b and 145c are connected, respectively. If necessary, a normally open contact 148 and a push button type switch 149 are connected between these connection lines.

When, for instance in the fire alarm device A, the voltage decrement detecting section applies an intermittent low potential level "L" pulse output to the inverter 111a, the output of the fire detecting section is maintained at "L", and the input of the inverter 110a is at "L" while the output is at "H". The flow of current from the "H" level output of the inverter 110a to the intermittent "L" level input of the inverter 111a is prevented by the diodes 140a and 141a. Similarly, in the other fire alarm devices B and C, the respective diodes 141b and 141c prevent the flow of current out of the "H" level input terminals of the respective inverters 111b and 111c. The respective diodes 140b and 140c prevent currents from flowing out of the "H" level output terminals of the respective inverters 110b and 110c.

Accordingly, the output of the voltage decrement detecting section in the fire alarm device A sets the input terminal of the inverter 111a thereof to "L", but has no effect on the other circuit elements. The inverter 111a inverts its "L" input to provide the "H" output, whereby the transistor 112a is rendered conductive. The conduction of the transistor 112a is intermittently carried out as described before, and therefore the warning unit 109a is intermittently operated to notify the consumption of the battery in the fire alarm device A.

When the fire detecting section in the fire alarm device A provides its output, the input of the inverter 110a is changed from "L" to "H", and the inverter 110a provides its inversion output "L". As a result, the input to the inverter 111a is lowered to "L" and the output of the inverter 111a is raised to "H". Hence the transistor 112a is rendered conductive to continuously operate the warning unit 109a, while the "L" output of the inverter 110a is applied through the diode 140a, the external connection terminal 144a and the connection line 146 to the external connection terminals 144b and 144c of the fire alarm means B and C. In the fire alarm devices B and C, when the external connection terminals 144b and 144c are set to "L", the input terminals of the inverters 111b and 111c are set to "L" respectively through the diodes 141b and 141c. Therefore, the output terminals of the inverters 111b and 111c are set to "H" to render the transistors 112b and 112c conductive to thereby operate the warning units 109b and 109c, respectively. Even if the fire detecting sections in the fire alarm devices B and C give no warning signals and the output terminals of the inverters 110b and 110c thereof are at "H", the diodes 140b and 140c prevent the currents from flowing out of the output terminals. Accordingly, the currents from the fire alarm devices B and C never flow to the inverter 110a of the fire alarm device A, which has given the warning signal, to cause potential overloads.

In the circuitry as shown in FIG. 7, ancillary circuitry such as a normally open contact 148 and the manual push button type switch 149 such as a thermal detector, a switch for preventing the entering of burglar, a buzzer for informing the full water in a bath, and an interphone switch may be connected between the connection lines 146 and 147. In this case, the warning units of all of the fire alarm device A, B and C are operated by the closure of the contact 148. Thus, the system can be employed for addition warning functions in addition to the fire warning function.

As is apparent from the above description, according to the invention, a general purpose warning system can be provided merely by connecting a plurality of fire alarm devices, which are completely equal in arrangement to one another, through their external connection terminals, and in this case no additional control device is required.

As is apparent from the above-description, in the multivibrator according to this invention, the connection point of the resistor and the capacitor in which the charge and discharge operation is carried out is connected to the C-MOS inverter through the switching transistor connected across the electric supply. Therefore, it is possible to cause the input voltage variation of the inverter to pass the threshold value quickly, and the power consumption of the inverter during the switching operation can be accordingly reduced. Since the on-off state of the transistor can be externally controlled by biasing it, the start and stop of the multivibrator's oscillation can be readily controlled. Accordingly, if this invention is employed to control the power supply of equipment which uses a small capacity electric source such as a dry cell, a variety of effects such as reduction of current consumption, warning of battery voltage decrement, voltage increment with small power consumption, etc. can be obtained.

What is claimed is:

1. A multivibrator comprising first and second C-MOS inverters each having an inverting threshold level and having respective input and output terminals, said C-MOS inverters being parallel-connected to a DC electric source; a capacitor; a first resistor; and a series circuit comprising a transistor and a second resistor, said series circuit connected in parallel with said electric source and having a voltage Va at a node common to said transistor and said second resistor, the input terminal of said first C-MOS inverter being connected to said node common to said transistor and said second resistor, the output terminal of said first C-MOS inverter being connected to the input terminal of said second C-MOS inverter, the output terminal of said second C-MOS inverter being connected through said first resistor and said capacitor, to its input terminal, the connection point of said capacitor and said first resistor being connected to the base of said transistor, wherein said transistor causes said voltage Va to cross said inverting threshold level substantially instantaneously.

2. The multivibrator of claim 1 wherein said transistor is a PNP type.

3. The multivibrator of claim 1 where said transistor is a NPN type.

4. In an alarm system having an alarm device including a sensor for detecting a condition, a D.C. power source, a warning system for providing an indication of the condition detected and a switching circuit for actuating said warning system upon reception of an output signal from said sensor, the improvement comprising, means for providing a high voltage from said power source to said sensor, said means comprising a multivibrator having first and second C-MOS inverters each having an inverting threshold level and having respective input and output terminals, said C-MOS inverters being parallel-connected to said DC electric source; a capacitor; a first resistor; and a series circuit comprising a transistor and a second resistor, said series circuit connected in parallel with said electric source and having a voltage Va at a node common to said transistor and said second resistor, the input terminal of said first C-MOS inverter being connected to said node common to said transistor and said second resistor, the output terminal of said first C-MOS inverter being connected to the input terminal of said second C-MOS inverter, the output terminal of said second C-MOS inverter being connected through said first resistor and said capacitor, to its input terminal, the connection point of said capacitor and said first resistor being connected to the base of said transistor, wherein said transistor causes said voltage Va to cross said inverting threshold level substantially instantaneously.

5. The alarm system of claim 4 further comprising voltage detection means including a second multivibrator circuit comprising third and fourth C-MOS inverters having respective input and output terminals, said C-MOS inverters being parallel-connected to said DC electric source; a second capacitor; a third resistor; and a series circuit comprising a second transistor and a fourth resistor, said series connected in parallel with said electric source, the input terminal of said third C-MOS inverter being connected to a connection point of said second transistor and said fourth resistor in said series circuit, the output terminal of said third C-MOS inverter being connected to the input terminal of said fourth C-MOS inverter, the output terminal of said fourth C-MOS inverter being connected through said third resistor and said second capacitor to its input terminal, the connection point of said second capacitor and said third resistor being connected to the base of said second transistor.

6. The alarm system of claim 5 wherein said first and second transistors are a NPN type.

7. The alarm system of claim 5 wherein said first and second transistors are a PNP type.

8. The alarm system of claim 5 wherein the emitters of said first and second transistors are coupled to the same terminal of said DC power source.

9. The alarm system of claims 4 or 5 wherein said sensor comprises a smoke detector, said smoke detector having a pair of ionization chambers separated by an electrode, and switch means coupled to said electrode to provide an output signal when smoke enters one of said pair of chambers.

10. The alarm system of claims 5 wherein said voltage detection means is coupled to said switching circuit to provide an output for actuating said warning system when the voltage of said power source falls below a predetermined value.

11. The alarm system of claim 10 further comprising external terminals coupled to said sensor and means coupling said switching circuit to said external terminal for inhibiting the output of said voltage detection means to said external terminal.

12. The alarm system of claim 11 further comprising a plurality of alarm devices, each alarm device coupled to each other by parallel external lines coupled to the external terminal of a discrete device, wherein the output from a sensor of a single alarm device will be transmitted to each device for actuation of the warning systems in all devices while the output of respective voltage detection means will actuate the warning system in only the alarm device where the low voltage condition has been sensed.

13. The alarm system of claims 4 or 5 wherein said switching circuit comprises a series circuit comprising a first inverter receiving the output of said sensor, first and second diodes, a second inverter, and transistor switch coupling said second inverter and said warning system.

14. The alarm circuit of claim 4 wherein said means for providing a high voltage from said power source to said sensor further comprises a booster circuit for multiplying the voltage from said power source to produce said high voltage.

15. A fire alarm system comprising: a DC electric source; environmental detecting means energized by said source to sense abnormal environmental conditions such as heat and smoke and provide an output signal; voltage decrement detecting and signalling means for detecting a voltage decrement of said DC electric source to provide an output signal; a warning unit; a switching circuit having an input terminal for operating said warning unit upon reception of the output signal from either said environmental detecting means or said voltage decrement detecting and signalling means through said input terminal thereof; and external connection terminals connected to the output of said environmental detecting means and to the input of said switching circuit; wherein said (i) environmental detecting means, (ii) voltage decrement detecting and signalling means, (iii) warning unit, (iv) switching circuit and (v) external connection terminals are provided in a single housing to define an alarm device, the output of said voltage decrement detecting and signalling means being connected to the input terminal of said switching circuit, said external connection terminals and the output of said environmental detecting means connected to the input terminal of said switching circuit by prevention means adapted to prevent the application of the output signal of said voltage decrement detecting means to the external connection terminals.

16. The alarm system of claim 15 further comprising a plurality alarm devices, each alarm device coupled to each other by a parallel external lines coupled to the external terminals of a discrete device, wherein the output from a detecting means of a single alarm device will be transmitted to each device for actuation of the warning units in all devices while the output of respective voltage decrement detecting means will actuate the warning unit in only the alarm device where the voltage condition has been sensed.

17. The alarm system of claims 15 or 16 further comprising means for providing a high voltage from said power source to said detecting means including a first multivibrator having first and second C-MOS inverters having respective input and output terminals, said C-MOS inverters being parallel-connected to a DC electric source; a capacitor; a first resistor; and a series circuit comprising a transistor and a second resistor, said series connected in parallel with said electric source, the input terminal of said first C-MOS inverter being connected to a connection point of said transistor and said second resistor in said series circuit, the output terminal of said first C-MOS inverter being connected to the input terminal of said second C-MOS inverter, the output terminal of said second C-MOS inverter being connected through said first resistor and said capacitor, to its input terminal, the connection point of said capacitor and said first resistor being connected to the base of said transistor.

18. The alarm system of claim 17 wherein said voltage decrement detection means includes a second multivibrator circuit comprising third and fourth C-MOS inverters having respective input and output terminals, said C-MOS inverters being parallel-connected to said DC electric source; a second capacitor; a third resistor; and a series circuit comprising a second transistor and a fourth resistor, said series connected in parallel with said electric source, the input terminal of said third C-MOS inverter being connected to a connection point of said second transistor and said fourth resistor in said series circuit, the output terminal of said third C-MOS inverter being connected to the input terminal of said fourth C-MOS inverter, the output terminal of said fourth C-MOS inverter being connected through said third resistor and said second capacitor to its input terminal, the connection point of said second capacitor and said third resistor being connected to the base of said second transistor.

19. The alarm system of claim 18 wherein said first and second transistors are a NPN type.

20. The alarm system of claim 18 wherein said first and second transistors are a PNP type.

21. The alarm system of claim 18 wherein the emitters of said first and second transistor are coupled to the same terminal of said DC power source.

22. The alarm system of claim 17 wherein said detecting means comprises a smoke detector, said smoke detector having a pair of ionization chambers separated by an electrode and switch means coupled to said electrode to provide an output signal when smoke enters one of pair of chambers.

23. The alarm system of claim 17 wherein said voltage decrement detection means is coupled to said switching circuit to provide an output for actuating said warning unit when the voltage of said power source falls below a predetermined value.

24. The alarm system of claim 15 wherein said means adapted to prevent the application of the output signal of the voltage decrement detection means to the external connection terminals comprises diode means coupling said switching circuit to said external connection terminals.

25. The alarm system of claim 24 further comprising a plurality of alarm devices, each alarm device coupled to each other by parallel external lines coupled to the external terminal of a discrete device, wherein, the output from a sensor of a single alarm device will be transmitted to each device for actuation of the warning systems in all devices while the output of respective voltage detection means will actuate the warning system in only the alarm device where the low voltage condition has been sensed.

26. The alarm system of claim 15 wherein said means adapted to prevent influence of said voltage detection means comprises a series circuit comprising a first inverter receiving the output of said sensor, first and second diodes, a second inverter and said switching circuit comprises transistor switch coupled said second inverter and said warning system.

27. The alarm circuit of claim 17 wherein said means for providing a high voltage from said power source to said sensor further comprises a booster circuit for multiplying the voltage from said power source to produce said high voltage.

28. The alarm circuit of claim 15 further comprising a booster circuit for multiplying the voltage produced by said DC electric source to provide high voltage to said environmental detecting means.

29. The fire alarm of claim 28 wherein said booster circuit comprises an astable multivibrator actuated by said voltage decrement detecting and signalling means, and a capacitor-diode circuit actuated by said astable multivibrator.

30. The fire alarm of claim 29 wherein said high voltage is provided across a capacitor in said capacitor-diode circuit.

31. The alarm circuit of claim 15 wherein said switching circuit comprises a first inverter having an input receiving the output of said voltage decrement detecting and signalling means, and an output applied to switch means to thereby actuate said warning unit in response to a signal of a first polarity from said first inverter, said environmental detecting means having an output connected to said input of said first inverter through said prevention means comprising a series connected of (i) a second inverter, (ii) a first diode and (iii) a second diode, said external connection terminal being located at the junction of said first and second diodes, whereby a signal having a second polarity opposite said first polarity from said voltage decrement detecting and signalling means actuates said switch means but is not applied to said external connection, and a signal of said first polarity from said environmental detecting means actuates said switch means and is applied to said external connection.

32. The multivibrator of claims 1 or 4 wherein said multivibrator produces a substantially square wave output and comprises not more than two C-MOS inverters.

* * * * *